US008409788B2

(12) United States Patent
Lee et al.

(10) Patent No.: US 8,409,788 B2
(45) Date of Patent: Apr. 2, 2013

(54) LASER INDUCED THERMAL IMAGING METHOD, METHOD OF PATTERNING ORGANIC LAYER USING THE SAME AND METHOD OF FABRICATING ORGANIC LIGHT EMITTING DIODE DISPLAY DEVICE USING THE SAME

(75) Inventors: Hyun-Chul Lee, Yongin (KR); Jin-Han Park, Yongin (KR); Hyung-Sik Kim, Yongin (KR); Won-Kyu Lim, Yongin (KR); Cheol-Lae Roh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 346 days.

(21) Appl. No.: 12/912,243

(22) Filed: Oct. 26, 2010

(65) Prior Publication Data

US 2011/0129779 A1    Jun. 2, 2011

(30) Foreign Application Priority Data

Nov. 30, 2009 (KR) .................. 10-2009-0116424

(51) Int. Cl.
*G03F 7/20* (2006.01)
(52) U.S. Cl. ........................................ 430/319
(58) Field of Classification Search .................. 430/322, 430/325, 312, 319
See application file for complete search history.

(56) References Cited

FOREIGN PATENT DOCUMENTS

| JP | 2002-289348 | 10/2002 |
|---|---|---|
| KR | 10-2004-0059089 A | 7/2004 |
| KR | 10-2006-0019452 | 3/2006 |
| KR | 10-2006-0034575 | 4/2006 |
| KR | 10-2007-0107527 | 11/2007 |
| KR | 10-0776473 B1 | 11/2007 |
| KR | 10-2008-0047781 A | 5/2008 |
| KR | 10-2008-0073945 A | 8/2008 |

*Primary Examiner* — Brittany Raymond
(74) *Attorney, Agent, or Firm* — Christie, Parker & Hale, LLP

(57) ABSTRACT

A laser induced thermal imaging (LITI) method, a method of patterning an organic layer using the same and a method of manufacturing an organic light emitting diode (OLED) display device using the same. The LITI method includes preparing a substrate including a transfer layer, preparing a donor substrate including a base film and a light-to-heat conversion layer disposed on the base film, aligning the substrate with the donor substrate, and irradiating laser to the base layer of the donor substrate. Here, the laser is irradiated to the base layer in a region excluding a region corresponding to a pattern to be formed on the substrate. Thus, according to the method, regardless of the size of the pattern to be formed and the size of the laser beam, stitching mura can be prevented.

20 Claims, 7 Drawing Sheets

LASER INDUCED THERMAL IMAGING METHOD, METHOD OF PATTERNING ORGANIC LAYER USING THE SAME AND METHOD OF FABRICATING ORGANIC LIGHT EMITTING DIODE DISPLAY DEVICE USING THE SAME

CROSS-REFERENCE TO RELATED APPLICATION

This application claims the benefit of Korean Patent Application No. 10-2009-0116424, filed Nov. 30, 2009, in the Korean Intellectual Property Office, the disclosure of which is hereby incorporated by reference in its entirety.

BACKGROUND OF THE INVENTION

1. Field of the Invention

Aspects of the present invention relate to a laser induced thermal imaging method, a method of patterning an organic layer using the same, and a method of fabricating an organic light emitting diode (OLED) display device using the same, and more particularly, to a method of patterning an organic layer using a reverse transfer phenomenon in a laser induced thermal imaging method.

2. Description of the Related Art

Today, the demand of a user to rapidly obtain exact information in one's hand is growing due to the advent of the high information age, and therefore, the development of display devices, which are lightweight and slim which can be easily held, and have a fast data processing speed, is rapidly progressing. Among the display devices, an organic light emitting diode (OLED) display device is a self-emitting device, which emits light by recombination of an electron with a hole in an organic light emitting layer when a voltage is applied to an organic layer including the organic emitting layer. For this reason, the OLED display device does not need a back light, unlike an LCD device, and thus can be manufactured to have a lightweight and slim body and have a simple process. In addition, the OLED display device has the same level of response speed as a cathode ray tube (CRT), and low voltage driving, high emission efficiency and a wide viewing angle. For this reason, attention to the OLED display device is increased sharply as a next generation display.

Here, according to the material for the organic layer, particularly, the organic emitting layer, the OLED display devices are classified into a small molecule OLED display device and a polymer OLED display device.

The small molecule OLED display device includes multiple organic layers having different functions, including a hole injection layer, a hole transport layer, an emitting layer, a hole blocking layer, and an electron injection layer, which are disposed between an anode and a cathode. Here, the layers can be controlled by being doped or replaced with a material having an appropriate energy level to prevent accumulation of charges. However, since the small molecule organic layer is formed by vacuum deposition, it is difficult to be used to implement a large-sized display.

On the other hand, the polymer OLED display device may be manufactured in a single-layer structure including an organic emitting layer between an anode and a cathode, or in a double-layer structure including a hole transport layer, so that the device becomes thinner. The organic layer is formed by wet coating at atmospheric pressure. As a result, a production cost can be reduced, and a large-sized OLED display device can be easily manufactured.

Here, a single-color device may be simply manufactured using a polymer OLED display device by spin coating, but it has a lower efficiency and a shorter lifespan than that manufactured using a small molecule OLED display device. A full-color device may be implemented by patterning emitting layers emitting the three primary colors such as R, G, and B to the OLED display device. Here, an organic layer of the small molecule OLED display device may be patterned through deposition using a shadow mask, and an organic layer of the polymer OLED display device may be patterned through inkjet printing or laser induced thermal imaging (LITI). Among them, the LITI method may utilize the characteristics of the spin coating method, so that when it is applied to a large-sized device, the device can obtain excellent uniformity in pixels. In addition, since the LITI method is a dry process, not a wet process, it can solve the problem of a decreasing lifespan due to a solvent, and achieve a fine pattern of the organic layer.

To apply the LITI method, basically, a light source, and organic light emitting diode substrates such as a substrate and a donor substrate are needed. The donor substrate is composed of a base layer, a light-to-heat conversion layer, and a transfer layer. According to the LITI method, light emitted from the light source is absorbed to the light-to-heat conversion layer of the donor substrate, and converted into thermal energy. Thereby, an organic material formed on the transfer layer is transferred to the substrate.

FIGS. 1A and 1B are cross-sectional views illustrating a conventional method of manufacturing an organic light emitting diode display device through a LITI method.

Referring to FIG. 1A, an insulating substrate 101 is prepared, and a first electrode 102 is formed on the insulating substrate by patterning.

Subsequently, a pixel defining layer 103 defining R, G and B pixel regions is formed, and thus a substrate 100 is completed.

Meanwhile, a light-to-heat conversion layer 32 and a transfer layer 33 are sequentially stacked on a base layer 31, and thus a donor substrate 30 is completed.

Afterwards, the pixel region of the substrate 100 is aligned to face the transfer layer of the donor substrate 30, and laser is irradiated to a region of the base layer 31 of the donor substrate to be transferred.

Subsequently, referring to FIG. 1B, after an organic light-emitting material is transferred to the pixel region of the substrate 100, the donor substrate 30 is removed, thereby forming an organic emitting layer pattern 33'.

Afterwards, as shown in FIG. 1C, a second electrode 104 is formed on the organic layer, and thus an OLED display device can be completed.

Consequently, according to the conventional art, to manufacture an OLED display device through a LITI method, laser is irradiated to the base layer in the region to be transferred to transfer the organic light-emitting material to the pixel region of the substrate.

However, due to the size (width) limit of a laser beam, the size of a pattern which can be transferred by a cycle of a transfer process is limited, and thus stitching mura occurs between widths of the laser beams.

FIG. 2 is a photograph showing stitching mura occurring in the conventional OLED display device manufactured by the LITI method, and referring to FIG. 2, due to the size limit of the laser beam, it can be seen that the stitching mura occurs between the widths of the laser beams.

SUMMARY OF THE INVENTION

Aspects of the present invention provide a method of patterning an organic layer which can prevent stitching mura occurring between widths of laser beams due to the size limit of the laser beam.

According to an aspect of the present invention, a laser induced thermal imaging method includes: preparing a substrate including a transfer layer; preparing a donor substrate including a base layer and a light-to-heat conversion layer disposed on the base layer; aligning the substrate with the donor substrate; and irradiating laser to the base layer of the donor substrate. Here, the laser is irradiated to the base layer in a region excluding a region corresponding to a pattern to be formed on the substrate.

According to another aspect of the present invention, a method of patterning an organic layer includes: preparing a substrate including an organic layer; preparing a donor substrate including a base layer and a light-to-heat conversion layer disposed on the base layer; aligning the substrate with the donor substrate; and irradiating laser to the base layer of the donor substrate. Here, the laser is irradiated to the base layer in a region excluding a region corresponding to a pattern to be formed on the substrate.

According to another aspect of the present invention, the laser may have a transfer energy intensity of 5 to 40 kW/cm$^2$.

According to another aspect of the present invention, after the substrate is aligned with the donor substrate, the donor substrate and the substrate may be laminated.

According to another aspect of the present invention, after the laser is irradiated to the base layer of the donor substrate, the donor substrate may be delaminated from the substrate.

According to another aspect of the present invention, through the delamination, the organic layer in the region excluding the region corresponding to the pattern to be formed on the substrate may be adhered to the donor substrate and thus separated.

According to still another aspect of the present invention, a method of manufacturing an organic light emitting diode display device includes: forming a first electrode layer on a substrate; forming an insulating layer on the first electrode layer to define a first pixel region, a second pixel region, and a third pixel region; applying a first light-emitting material to the entire surface of the substrate including the first, second and third pixel regions; preparing a donor substrate including a base layer and a light-to-heat conversion layer disposed on the base layer; aligning the substrate with the donor substrate; and irradiating a laser to the base layer of the donor substrate. Here, the laser is irradiated to the base layer in a region excluding a region corresponding to the first pixel region.

According to another aspect of the present invention, after the laser is irradiated to the base layer in the region excluding the region corresponding to the first pixel region, the donor substrate may be delaminated from the substrate, and through the delamination, the first light-emitting material in the region excluding the region corresponding to the first pixel region may be adhered to the donor substrate and thus separated, and the first light-emitting material in the region corresponding to the first pixel region may remain on the substrate, thereby forming a first light-emitting material pattern.

According to another aspect of the present invention, the method may further include applying a second light-emitting material to the entire surface of the substrate including the first light-emitting material pattern; preparing a donor substrate including a base layer and a light-to-heat conversion layer disposed on the base layer; aligning the substrate with the donor substrate; and irradiating the laser to the base layer of the donor substrate. Here, the laser may be irradiated to the base layer in a region excluding a region corresponding to the second pixel region.

According to another aspect of the present invention, after the laser is irradiated to the base layer in the region excluding the region corresponding to the second pixel region, the donor substrate may be delaminated from the substrate, and, through the delamination, the second light-emitting material in the region excluding the region corresponding to the second pixel region may be adhered to the donor substrate and thus separated, and the second light-emitting material in the region corresponding to the second pixel region may remain on the substrate, thereby forming a second light-emitting material pattern.

According to another aspect of the present invention, the method may further include applying a third light-emitting material to the entire surface of the substrate including the first and second light-emitting material patterns; preparing a donor substrate including a base layer and a light-to-heat conversion layer disposed on the base layer; aligning the substrate with the donor substrate; and irradiating laser to the base layer of the donor substrate. Here, the laser may be irradiated to the base layer in a region excluding a region corresponding to a third pixel region.

According to another aspect of the present invention, after the laser is irradiated to the base layer in the region excluding the region corresponding to the third pixel region, the donor substrate may be delaminated from the substrate, and, through the delamination, the third light-emitting material in the region excluding the region corresponding to the third pixel region may be adhered to the donor substrate and thus separated, and the third light-emitting material in the region corresponding to the third pixel region may remain on the substrate, thereby forming a third light-emitting material pattern.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1A:
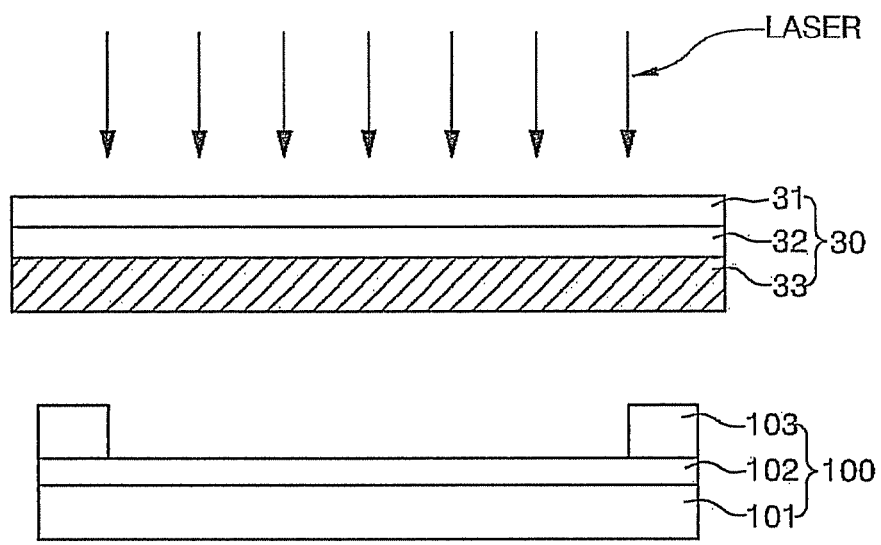
FIGS. 1A to 1C are cross-sectional views illustrating a conventional process of manufacturing an organic light emitting diode (OLED) display device by a laser induced thermal imaging (LITI) method.
Figure 1B:
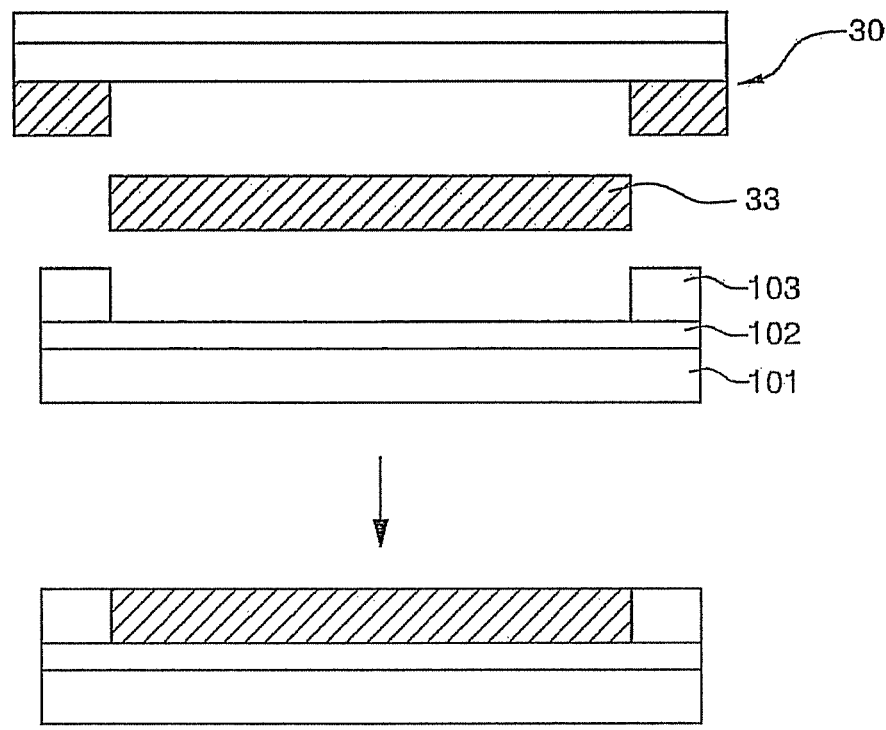
Figure 1C:
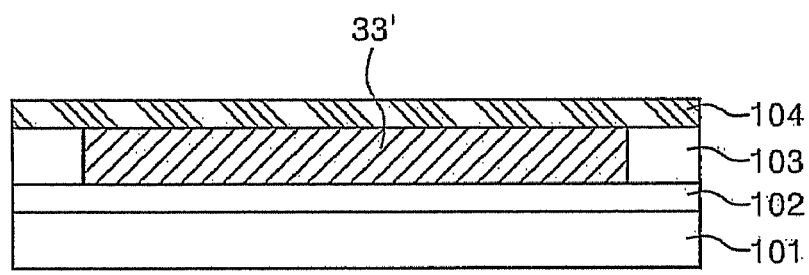
Figure 2:
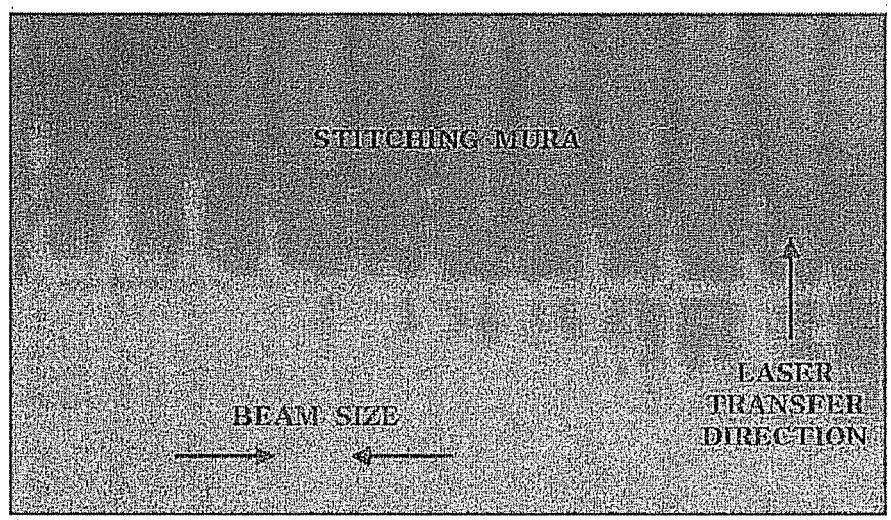
FIG. 2 is a photograph showing stitching mura occurring in the conventional OLED display device manufactured by the LITI method.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Moreover, it is to be understood that where it is stated herein that one film or layer is "disposed on" a second layer or film, the first layer or film may be disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

Figure 3:
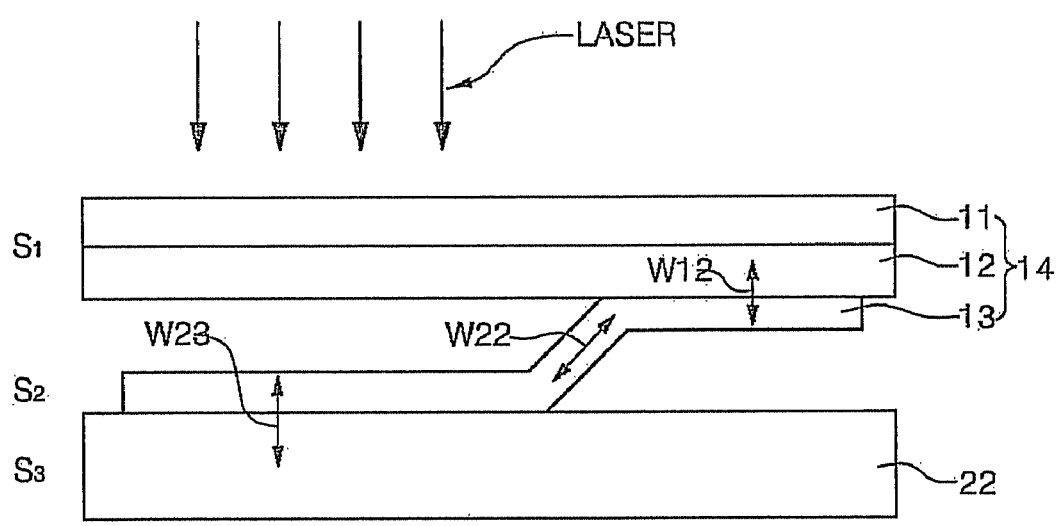
FIG. 3 is a cross-sectional view illustrating a transfer mechanism of a common process of transferring an organic layer according to a LITI method.

FIG. 3 is a cross-sectional view illustrating a transfer mechanism of a common process of transferring an organic layer according to a LITI method. As shown in FIG. 3, according to a common mechanism of transfer-patterning an organic layer using laser, an organic layer S2 13 adhered to a substrate S1 is released from the substrate S1 due to the action of laser, and transferred to a substrate S3, resulting in separation from a portion irradiated with laser.

A transfer characteristic is determined by a first adhesion W12 between the substrate S1 and a film S2, a cohesion W22 between films, and a second adhesion W23 between the film S2 and the substrate S3.

The first and second adhesions are expressed by the following equations, in which a surface tension of each layer is represented as $\gamma 1$, $\gamma 2$, or $\gamma 3$, and an interfacial tension of each layer is represented as $\gamma 12$ or $\gamma 23$.

$$W12 = \gamma 1 + \gamma 2 - \gamma 12$$

$$W22 = 2\gamma 2$$

$$W23 = \gamma 2 + \gamma 3 - \gamma 23$$

To improve the laser transfer characteristic, the cohesion between the films should be smaller than the adhesion between each substrate and the film.

Meanwhile, in order to transfer the transfer layer 13 from a donor substrate 14 to a substrate 22 according to a general concept of the transfer mechanism, laser is irradiated to a base layer 11, and converted into thermal energy due to a light-to-heat conversion layer 12 formed on the base layer 11, and an adhesion between the transfer layer 13 and the light-to-heat conversion layer 12 is changed. Thus, the transfer layer disposed in the region irradiated with laser is transferred to the substrate.

However, the present inventors found that, when laser transfer energy has a predetermined intensity or more, removing the donor substrate 14 from the substrate 22 is performed fast, and the transfer layer 13 disposed in the region irradiated with laser is not transferred to the substrate 22, but remains on the donor substrate 14, resulting in occurrence of a reverse transfer phenomenon.

In other words, the reverse transfer phenomenon refers to a phenomenon occurring when the adhesion W12 between the light-to-heat conversion layer 12 and the transfer layer 13 is larger than W23 between the substrate 22 and the transfer layer 13. The present inventors found that the reverse transfer phenomenon occurs when the laser transfer energy has a predetermined intensity or more, and thus a novel method of patterning an organic layer according to an aspect of the present invention was devised.

Hereinafter, a method of pattering an organic layer according to an aspect of the present invention will be described.

FIGS. 4A through 4G are cross-sectional views illustrating a process of manufacturing a full-color OLED display device using a method of patterning an organic layer according to an aspect of the present invention.

While the method of manufacturing a full-color OLED display device is illustrated for convenience of the description, there is no limitation to an organic layer which can be manufactured by the method of patterning an organic layer according to an aspect of the present invention.

Figure 4A:
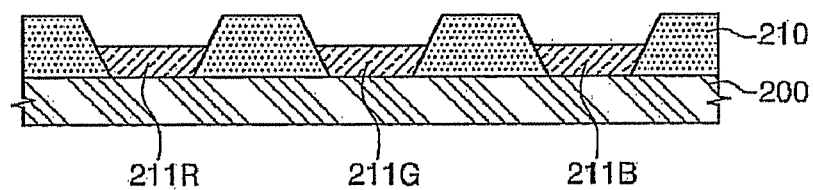
FIGS. 4A through 4G are cross-sectional views illustrating a process of manufacturing a full-color OLED display device using a method of patterning an organic layer according to an embodiment of the present invention.

Referring to FIG. 4A, an insulating substrate 200 including first, second and third pixel regions is provided, and a transparent electrode material or a metal electrode material is deposited and patterned on the substrate 200, thereby forming first electrode layers 211R, 211G, and 211B in the first, second and third pixel regions, respectively. The first electrode layers 211R, 211G, and 211B is formed of a reflective layer, that is, a metal layer in a top emission structure, or formed of a transparent electrode, ITO or IZO in a bottom emission structure. Here, a second electrode layer 230 to be described later will be formed of a transparent electrode in the top emission structure, or formed in a structure in which a transparent electrode material is stacked on a reflective layer formed of a metallic material, or a reflective plate in the bottom emission structure. When the first electrode layers 211R, 211G, and 211B are cathode electrode layers, the second electrode layer 230 becomes an anode electrode layer, or when the first electrodes 211R, 211G, and 211B are anode electrode layers, the second electrode layer 230 becomes a cathode electrode layer.

Afterwards, an insulating layer 210 is formed on the first electrode layers 211R, 211G, and 211B to define red, green and blue pixel regions R, G and B, respectively.

Here, the first pixel region may correspond to the red pixel region, the second pixel region to the green pixel region, and the third pixel region to the blue pixel region.

Figure 4B:
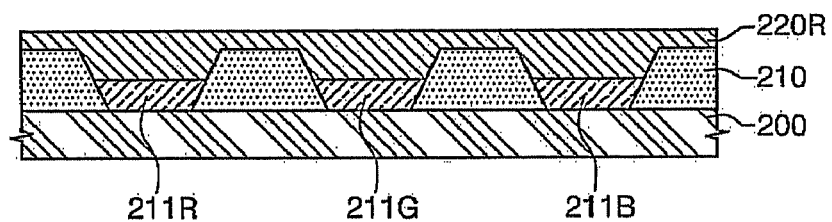

Then, referring to FIG. 4B, a red light-emitting material 220R, as a transfer layer, is applied to the entire surface of the substrate including the insulating layer 210.

In other words, according to the conventional method of manufacturing an OLED display device by a LITI method, a layer to be transferred, that is, a transfer layer is formed on the donor substrate, but according to an aspect of the present invention, the transfer layer is formed on the substrate 200.

The red light-emitting material 220R may be dissolved in a solvent and applied in a solution state by wet coating. The wet coating methods may include spin coating, dip coating, spraying, screen coating and inkjet printing. Other than them, a general method used in the art can also be used.

Figure 4C:
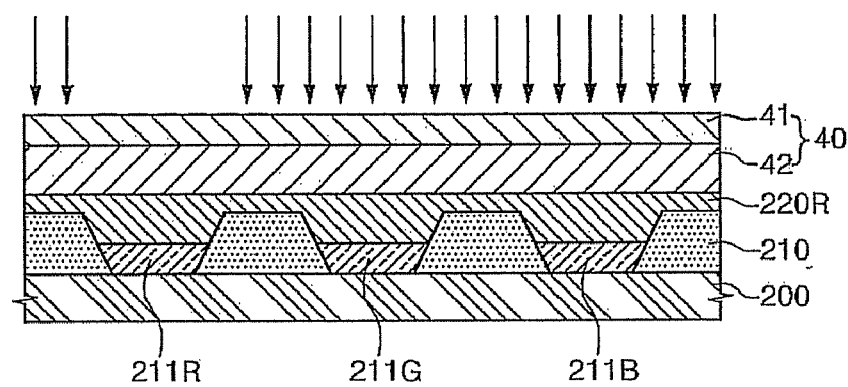

Next, referring to FIG. 4C, the donor substrate 40 is aligned with the top of the red light-emitting material 220R.

The donor substrate 40 includes a base layer 41 and a light-to-heat conversion layer 42, which are sequentially stacked.

Since laser is applied to the base layer, and transferred to the light-to-heat conversion layer 42, the base layer 41 may be formed of a transparent material. For example, the base layer 41 may be formed of at least one of the group consisting of polymer materials such as polyester, polyacryl, polyepoxy, polyethylene, and polystyrene, or a glass substrate. Preferably, but not necessarily, the base layer 41 may be formed of polyethyleneterephthalate.

The light-to-heat conversion layer 42 formed on the base layer 41 is a layer absorbing light in a infrared-visible light range, and converting a part of the light into heat, which may have an appropriate optical density and include a light-absorbing material for absorbing light. Here, the light-to-heat conversion layer 42 may be formed of a metal layer composed of Al, Ag, and an oxide and sulfide thereof, or an organic layer composed of carbon black, graphite or a polymer containing an infrared dye. Here, the metal layer may be formed by vacuum deposition, electron beam deposition or sputtering, and the organic layer may be formed by a conventional film coating method, for example, one of roll coating, gravure, extrusion, spin coating, and knife coating.

Afterwards, the donor substrate 40 and the substrate 200 are subjected to a lamination process. According to the lamination process, the donor substrate 40 and the substrate 200 are fixed, and compressed for lamination, thereby removing bubbles between the donor substrate 40 and the substrate 200.

Then, laser is irradiated to the base layer 41 of the donor substrate 40. Here, unlike the conventional art, laser is irradiated to the base layer 41 in a region excluding a region corresponding to a pattern to be formed on the substrate 200.

In other words, according to the conventional method of manufacturing an OLED display device by a LITI method, laser is irradiated to the base layer in a region to be transferred, and an organic light-emitting material is transferred to the pixel region of the substrate.

However, in an aspect of the present invention, after a material for a layer to be transferred is formed on the entire surface of the substrate 200, the donor substrate 40 and the substrate 200 are aligned and subjected to lamination. Subsequently, laser is irradiated to the base layer 41 of the donor substrate 40, excluding the region corresponding to the pattern to be formed on the substrate 200. Thus, in this operation, since a material for a layer to be transferred is a red light-emitting material 220R, laser is irradiated to the base layer 41 in the region excluding the region corresponding to the red pixel region 211R.

In other words, since an organic layer is patterned using the reverse transfer phenomenon described above, the irradiated laser is converted into thermal energy due to the light-to-heat conversion layer formed on the base layer, and the adhesion between the layer of the red light-emitting material 220R and the light-to-heat conversion layer 42 is created by the thermal energy, and becomes larger than the adhesion between the substrate 200 and the red light-emitting material 220R.

Here, for the reverse transfer phenomenon, the laser transfer energy should have a predetermined intensity or higher than a predetermined intensity, which may be 5 kW/cm$^2$ or more.

Even if the laser transfer energy has an intensity of less than 5 kW/cm$^2$, the reverse transfer phenomenon may occur. However, for effective transfer quality, the laser transfer energy may have an intensity of 5 kW/cm$^2$ or more.

Meanwhile, the laser transfer energy may have an intensity of 40 kW/cm$^2$ or less. If the laser transfer energy has an intensity of more than 40 kW/cm$^2$, the organic layer may be damaged.

Figure 4D:
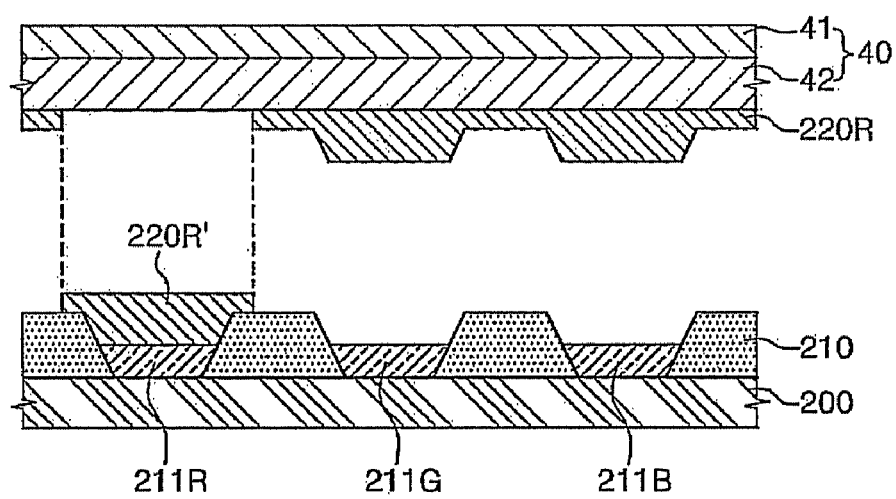

Subsequently, referring to FIG. 4D, a red light-emitting material pattern 220R' is formed on the substrate 200 through delamination which is used to separate the donor substrate 40 from the substrate 200.

In other words, when the delamination process is performed to separate the donor substrate 40 from the substrate 200, the region excluding the region corresponding to a pattern to be formed on the substrate has an adhesion between the light-heat conversion layers due to the irradiation of laser, thereby being adhered to the donor substrate and thus separated. The region corresponding to the pattern to be formed on the substrate is not irradiated with laser, so that it cannot see any change in adhesion, and the region remains on the substrate 200.

Figure 4E:
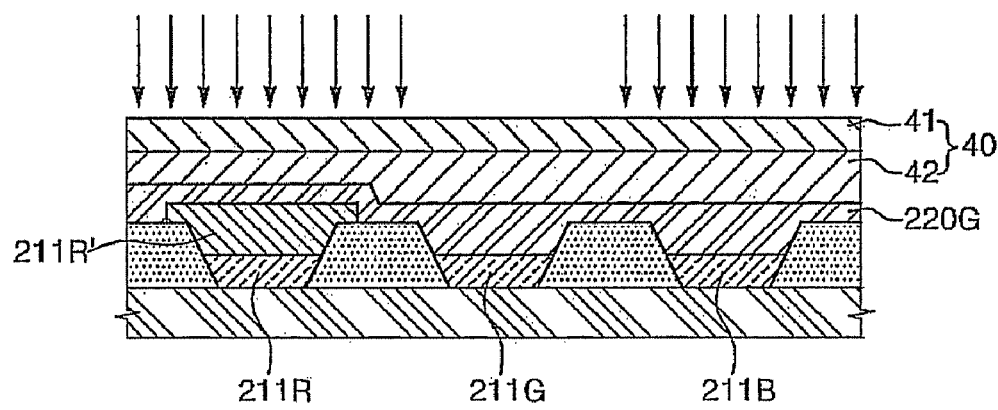

Subsequently, referring to FIG. 4E, a green light-emitting material 220G is applied to the entire surface of the substrate 200 including the red light-emitting material pattern 220R'.

The green light-emitting material 220G is dissolved in a solvent and applied in a solution state by wet coating. The wet coating methods may include spin coating, dip coating, spraying, screen printing and inkjet printing, and other than them, a general method in the art can also be used.

Afterwards, the donor substrate 40 is aligned with the top of the green light-emitting material 220G, and the donor substrate 40 and the substrate 200 are subjected to lamination. Subsequently, laser is irradiated to the base layer of the donor substrate 40. Here, the laser is irradiated to the layer of the green light-emitting material 220G by the same method as irradiating laser to the red light-emitting material 220R. That is, the laser is irradiated to the base layer in the region excluding the region corresponding to the pattern to be formed on the substrate 200. Meanwhile, in this operation, since a material for the layer to be transferred is a green light-emitting material, laser is irradiated to the base layer 41 in a region excluding a region corresponding to the green pixel region 211G.

Figure 4F:
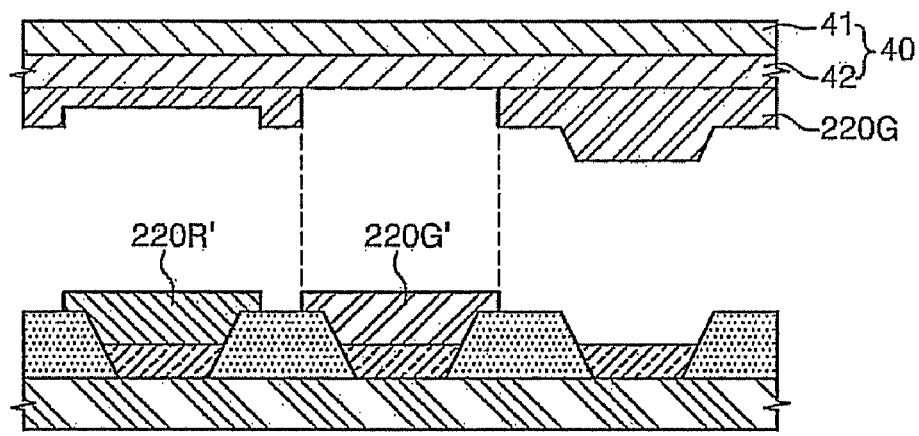

Subsequently, referring to FIG. 4F, a green light-emitting material pattern 220G' is formed on the substrate 200 through delamination which is used to separate the donor substrate 40 from the substrate 200.

Here, the green light-emitting material pattern 220G' is formed by the same principle as forming the red light-emitting material pattern 220R', and thus a detailed description thereof will be omitted.

Meanwhile, when the green light-emitting material 220G is formed on the entire surface of the substrate to form the green light-emitting material pattern 220G', the substrate also includes the red light-emitting material pattern 220R', and thus the green light-emitting material 220G is formed on the red light-emitting material pattern 220R'.

In this case, in the delamination process which separates the donor substrate 40 from the substrate 200 to form the green light-emitting material pattern 220G', can also be used to remove the red light-emitting material pattern 220R'.

For this reason, after the red light-emitting material pattern 220R' is formed, heat treatment may be performed to dry the substrate including the red light-emitting material pattern 220R'.

To be specific, after the red light-emitting material pattern 220R' is formed, the transferred material is treated with heat to solidify and fix, thereby changing an interfacial characteristic of the red light-emitting material pattern 220R', and thus declining an adhesion strength between the red light-emitting material pattern 220R' and the layer of the green light-emitting material 220G. As a result, the layer of the green light-emitting material 220G may be easily separated from the red light-emitting material pattern 220R' through the delamination process performed to separate the donor substrate 40 from the substrate 200.

Such process can be a concern when different organic layers are patterned on the substrate, however, this is not the case when a single material layer is formed on the substrate by patterning the organic layer according to an aspect of the present invention.

Figure 4G:
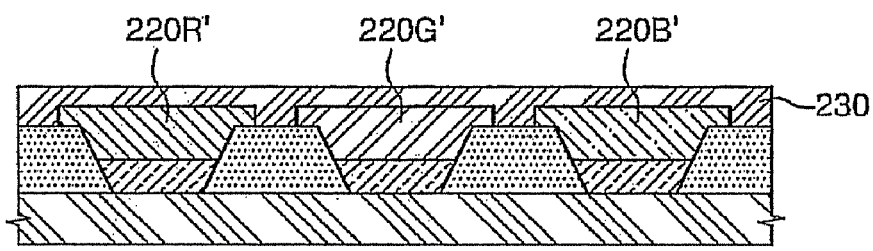

Subsequently, referring to FIG. 4G, like the method of forming the green light-emitting material pattern 220G', a blue light-emitting material is applied to the entire surface of the substrate 200 including the red and green light-emitting material patterns 220R' and 220G', and a blue light-emitting material pattern 220B' may be formed by the patterning method as described above. Thus, a detailed description thereof will be omitted.

Afterwards, a second electrode layer 230 is formed on the entire surface of the substrate 200 including the red, green and blue light-emitting material patterns 220R', 220G' and 220B', and subjected to a conventional encapsulation process, thereby manufacturing a full-color OLED display device according to an exemplary embodiment of the present invention.

Here, the organic layer of the full-color OLED display device according to an embodiment of the present invention may further include a hole injection layer, a hole transport layer, a hole blocking layer, an electron transport layer, and an electron injection layer between the first electrode layer 211 and the second electrode layer 230 by the method of patterning an organic layer.

In other words, as described above, as the transfer layer formed on the substrate 200, materials for emitting layers such as red, green and blue light-emitting materials are described, but the transfer layer may also be formed of a single layer selected from the group consisting of organic layers such as an emitting layer, a hole injection layer, a hole transport layer, an electron injection layer, and an electron transport layer, or a multiple layer including at least two thereof.

Since, in an aspect of the present invention, the organic layer is patterned using a reverse transfer phenomenon, laser is irradiated to the base layer in the region excluding the region corresponding to the pattern to be formed on the substrate.

To be specific, according to the conventional art, laser is irradiated to the region corresponding to the pattern to be formed on the substrate, so that when the pattern to be formed is larger than the size (width) of the laser beam, transfer is impossible and therefore must be accomplished by a cycle of transfer processes. Accordingly, several cycles of the transfer processes are needed to form a pattern, and thus stitching mura occurs between the widths of the laser beams. However, according to an aspect of the present invention, laser is irradiated to the region excluding the region corresponding to the pattern to be formed on the substrate, regardless of the size of the pattern to be formed and the size (width) of the laser beam, thereby preventing stitching mura.

Consequently, according to an aspect of the present invention, since laser is irradiated to a region excluding a region corresponding to a pattern to be formed on a substrate, stitching mura can be prevented regardless of the size of the pattern to be formed and the size (width) of the laser beam.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A laser induced thermal imaging method, comprising:
   preparing a substrate including a transfer layer;
   preparing a donor substrate including a base layer and a light-to-heat conversion layer disposed on the base layer;
   aligning the substrate with the donor substrate; and
   irradiating laser to the base layer of the donor substrate,
   wherein the laser is irradiated to the base layer in a region excluding a region corresponding to a pattern to be formed on the substrate.

2. The method according to claim 1, wherein the laser has a transfer energy intensity of 5 to 40 kW/cm$^2$.

3. The method according to claim 1, further comprising, after the substrate is aligned with the donor substrate, laminating the donor substrate and the substrate.

4. The method according to claim 1, further comprising, after the laser is irradiated to the base layer of the donor substrate, delaminating the donor substrate from the substrate.

5. The method according to claim 4, wherein the transfer layer, in the region excluding the region corresponding to the pattern to be formed on the substrate, is adhered to the donor substrate and separated from the substrate through the delamination.

6. A method of patterning an organic layer, comprising:
   preparing a substrate including an organic layer;
   preparing a donor substrate including a base layer and a light-to-heat conversion layer disposed on the base layer;
   aligning the substrate with the donor substrate; and
   irradiating laser to the base layer of the donor substrate,
   wherein the laser is irradiated to the base layer in a region excluding a region corresponding to a pattern to be formed on the substrate.

7. The method according to claim 6, wherein the laser has a transfer energy intensity of 5 to 40 kW/cm$^2$.

8. The method according to claim 6, further comprising, after the substrate is aligned with the donor substrate, laminating the donor substrate and the substrate.

9. The method according to claim 6, further comprising, after the laser is irradiated to the base layer of the donor substrate, delaminating the donor substrate from the substrate.

10. The method according to claim 9, wherein the organic layer, in the region excluding the region corresponding to the pattern to be formed on the substrate, is adhered to the donor substrate and separated from the substrate through to the delamination.

11. The method according to claim 6, wherein the organic layer is formed of a single layer selected from the group consisting of an emitting layer, a hole injection layer, a hole transport layer, an electron injection layer, and an electron transport layer, or a multiple layer including at least two thereof.

12. A method of manufacturing an organic light emitting diode (OLED) display device, comprising:
   forming a first electrode layer on a substrate;
   forming an insulating layer on the first electrode layer to define a first pixel region, a second pixel region, and a third pixel region;
   applying a first light-emitting material to the entire surface of the substrate including the first, second and third pixel regions;
   preparing a donor substrate including a base layer and a light-to-heat conversion layer disposed on the base layer;
   aligning the substrate with the donor substrate; and
   irradiating a laser to the base layer of the donor substrate,
   wherein the laser is irradiated to the base layer in a region excluding a region corresponding to the first pixel region.

13. The method according to claim 12, further comprising, after the laser is irradiated to the base layer in the region excluding the region corresponding to the first pixel region,
   delaminating the donor substrate from the substrate,
   wherein, through the delamination, the first light-emitting material in the region excluding the region corresponding to the first pixel region is adhered to the donor substrate and thus separated, and the first light-emitting material in the region corresponding to the first pixel region remains on the substrate, thereby forming a first light-emitting material pattern.

14. The method according to claim 13, further comprising:

applying a second light-emitting material to the entire surface of the substrate including the first light-emitting material pattern;

preparing a donor substrate including a base layer and a light-to-heat conversion layer disposed on the base layer;

aligning the substrate with the donor substrate; and irradiating the laser to the base layer of the donor substrate, wherein the laser is irradiated to the base layer in a region excluding a region corresponding to the second pixel region.

15. The method according to claim 14, further comprising, after the laser is irradiated to the base layer in the region excluding the region corresponding to the second pixel region, delaminating the donor substrate from the substrate, wherein, through the delamination, the second light-emitting material in the region excluding the region corresponding to the second pixel region is adhered to the donor substrate and thus separated, and the second light-emitting material in the region corresponding to the second pixel region remains on the substrate, thereby forming a second light-emitting material pattern.

16. The method according to claim 15, further comprising:

applying a third light-emitting material to the entire surface of the substrate including the first and second light-emitting material patterns;

preparing a donor substrate including a base layer and a light-to-heat conversion layer disposed on the base layer;

aligning the substrate with the donor substrate; and irradiating the laser to the base layer of the donor substrate, wherein the laser is irradiated to the base layer in a region excluding a region corresponding to the third pixel region.

17. The method according to claim 16, further comprising, after the laser is irradiated to the base layer in the region excluding the region corresponding to the third pixel region, delaminating the donor substrate from the substrate, wherein, through the delamination, the third light-emitting material in the region excluding the region corresponding to the third pixel region is adhered to the donor substrate and thus separated, and the third light-emitting material in the region corresponding to the third pixel region remains on the substrate, thereby forming a third light-emitting material pattern.

18. The method according to claim 12, wherein the laser has a transfer energy intensity of 5 to 40 kW/cm$^2$.

19. The method according to claim 13, further comprising, after the first light-emitting material pattern is formed, performing thermal treatment to dry the substrate including the first light-emitting material pattern.

20. The method according to claim 12, wherein the first pixel region is a red pixel region, the second pixel region is a green pixel region, and the third pixel region is a blue pixel region.

* * * * *